(12) United States Patent
Tanaka

(10) Patent No.: US 7,423,513 B2
(45) Date of Patent: Sep. 9, 2008

(54) CIRCUIT BOARD HAVING RESISTOR AND METHOD FOR MANUFACTURING THE CIRCUIT BOARD

(75) Inventor: Koichi Tanaka, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 189 days.

(21) Appl. No.: 10/855,342

(22) Filed: May 28, 2004

(65) Prior Publication Data

US 2004/0252010 A1 Dec. 16, 2004

(30) Foreign Application Priority Data

Jun. 13, 2003 (JP) ............................. 2003-169627

(51) Int. Cl.
*H01C 10/32* (2006.01)

(52) U.S. Cl. ..................... 338/162; 219/543; 338/195; 338/13

(58) Field of Classification Search .............. 338/13, 338/195, 308–309, 162; 219/543; 427/101, 427/103; 361/748, 766; 174/256
See application file for complete search history.

(56) References Cited

U.S. PATENT DOCUMENTS

| | | | | |
|---|---|---|---|---|
| 3,909,680 A * | 9/1975 | Tsunashima | ............... | 338/309 |
| 4,035,613 A * | 7/1977 | Sagawa et al. | ............... | 219/543 |
| 5,593,722 A * | 1/1997 | Otani et al. | ............... | 427/101 |
| 6,897,761 B2 * | 5/2005 | Ernsberger et al. | ............ | 338/309 |

FOREIGN PATENT DOCUMENTS

JP 2001-085207 3/2001

* cited by examiner

*Primary Examiner*—K. Richard Lee
(74) *Attorney, Agent, or Firm*—Staas & Halsey LLP

(57) ABSTRACT

A circuit board high in reliability and a method for manufacturing the circuit board are provided. The electrical resistance is accurately adjustable without damaging the circuit body even if it is made of resinous material and is free from a change over time. A circuit board in which a resistor (16) consisting of a resistor paste is printed between electrodes (14a) formed on a circuit pattern (14) printed on a printed circuit board (11), wherein a conductor (18) for adjusting the electrical resistance value of the resistor is coated on the surface of the resistor.

4 Claims, 5 Drawing Sheets

CIRCUIT BOARD HAVING RESISTOR AND METHOD FOR MANUFACTURING THE CIRCUIT BOARD

BACKGROUND OF THE INVENTION

1. Field of the Invention

The present invention relates to a circuit board having a resistor, formed thereon with resistor paste, of which the electrical resistance is adjustable, and a method for manufacturing such a circuit board. More specifically, this invention relates to a circuit board having a resistor formed thereon of which the electrical resistance is accurately adjustable without damaging the circuit board.

2. Description of the Related Art

There is a circuit board product, carrying a semiconductor element thereon, in which a resistor is formed in the circuit board by, for example, printing resistor paste such as carbon paste on the circuit board itself. When the resistor is formed by a screen printing method, carbon paste is coated on the circuit board in accordance with a predetermined pattern and heated at a suitable temperature for hardening the carbon paste. At this time, it is difficult to uniformly coat the circuit board with the carbon paste in thickness and width due to variations in the printing process and, also, the resistor may be unevenly heat-treated to result in a variation in electrical resistance value in the resistor.

In such a manner, when the resistor is formed in the circuit board by the printing method, there are many cases in that the designed electrical resistance value of the resistor is not obtainable.

Accordingly, a trimming treatment, using a laser, is widely used so that the electrical resistance value of the resistor is set within a designed tolerance. The laser trimming method for adjusting the resistance value of the resistor is a method for correcting the electrical resistance value of the resistor to a required value by irradiating a laser beam onto the resistor formed on the circuit board to partially narrow the resistor. For example, as disclosed in Japanese Unexamined Patent Publication (Kokai) No. 2001-085207, a technique for trimming the resistor, with high accuracy and within a short time, has been developed.

However, in a resinous circuit board, there is problem in that the circuit board may be damaged when the resistor is trimmed by irradiation of a laser beam.

Also, there is a problem, in the reliability of the circuit board, in that micro-cracks generated in the resistor during the laser trimming may vary the electrical resistance value of the resistor over time.

SUMMARY OF THE INVENTION

The present invention has been made to solve such problems and an object thereof is to provide a circuit board in which the electrical resistance value of a resistor is accurately adjusted and is high in reliability and free from a change with time, and a method for producing such a circuit board.

The present invention is as follows:

A circuit board in which a resistor paste is printed between electrodes formed on a circuit pattern printed on a printed circuit board, wherein a conductor for adjusting the electrical resistance value of the resistor, having a conductivity higher than that of the resistor, is coated on the surface of the resistor.

According to another aspect of the present invention, a method for producing a circuit board is provided, comprising a process for forming a circuit pattern on the surface of a circuit board, a process for printing a resistor between electrodes in the circuit pattern with resistor paste, a process for measuring the electrical resistance value of the resistor, and a process for forming a conductor, of a predetermined area for adjusting the electrical resistance value, having a conductivity higher than that of the resistor on the surface of the resistor if the measured electrical resistance value is outside the designed tolerance thereof.

Thereby, it is possible to provide a circuit board high in reliability, without damaging the circuit board, and free from a variation in electrical resistance over time when the error in the electrical resistance value of the resistor is generated during the process for forming the resistor.

Preferably, in the process for forming the conductor of the predetermined area for adjusting the electrical resistance, a conductive paste is coated in a predetermined area on the surface of the resistor.

Thereby, it is possible to easily and accurately adjust the electrical resistance value of the printed resistor, without any risk in that the electrical resistance value of the printed resistor will vary with time, whereby a circuit board high in reliability can be provided.

Further, in the process for forming the conductor of the predetermined area for adjusting the electrical resistance value, a conductor is preferably plated in a predetermined area on the surface of the resistor.

Thereby, as the conductor for adjusting the electrical resistance value can be formed by using a conventional plating device, the electrical resistance value is adjustable with only a small increase in production cost without the necessity of a novel installation therefor.

A plurality of conductor spots can be attached onto the surface of the resistor by ink jet processing.

DESCRIPTION OF THE PREFERRED EMBODIMENTS

The preferred embodiments of the circuit board according to this invention will be described below with reference to the attached drawings.

Figure 1:
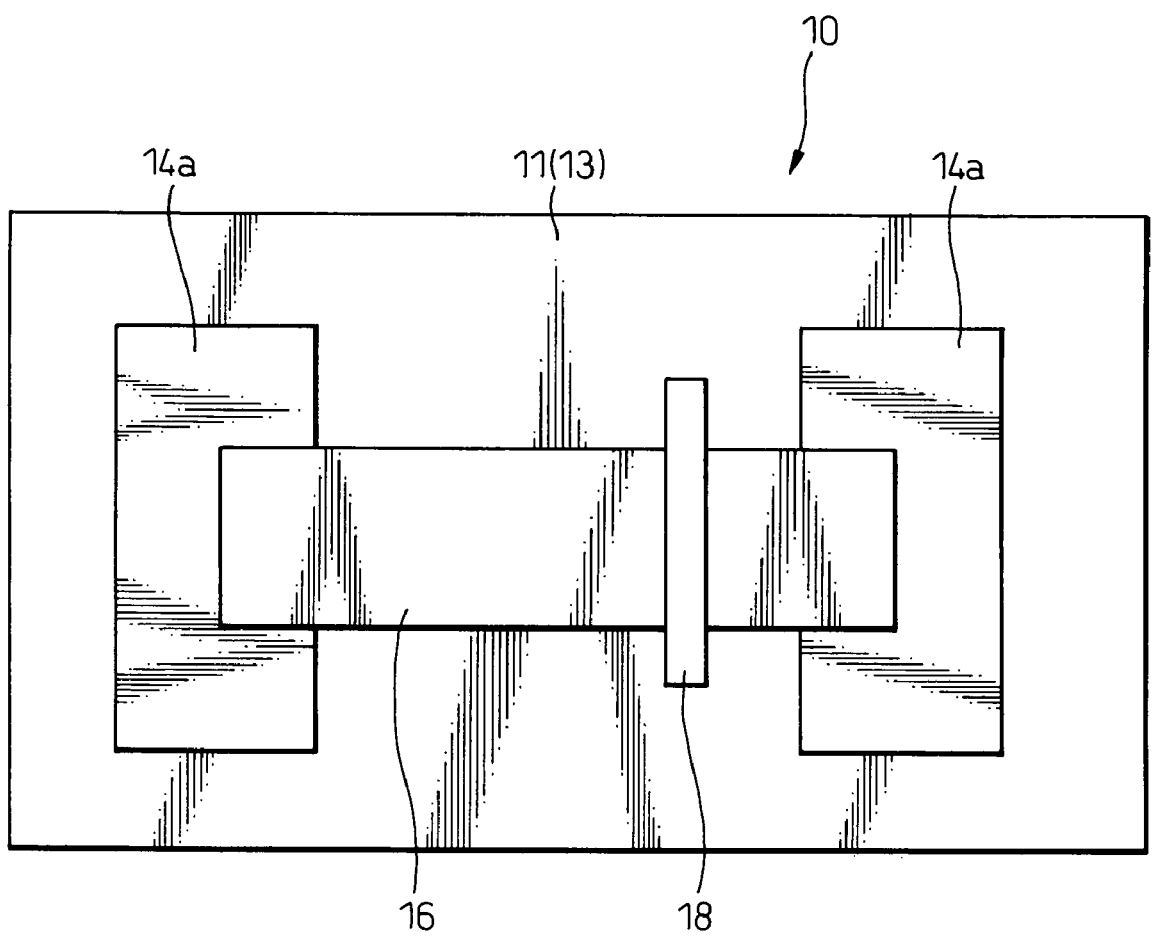
FIG. 1 is an enlarged plan view of part of a circuit board on which a resistor is formed.

FIG. 1 is an enlarged plan view of part of a circuit board in which a resistor is formed. As shown in FIG. 1, a resistor 16 is provided between a pair of electrodes 14a and 14a having a predetermined width in accordance with a predetermined pattern on the surface of a circuit board 10.

The resistor 16 of this embodiment is formed by printing carbon paste of an epoxy resin-type carbon black mixed with a conductive filler. The electrical resistance value of the resistor 16 is determined by the distance between the electrodes 14a and 14a, the width and the thickness of the resistor 16, and the resistance value of the paste used in the resistor 16. Accordingly, when the resistor 16 is formed in the circuit board 10, the distance between the electrodes 14a and 14a, the width and the thickness of the resistor 16 are set to match the resistance value of the paste used for the respective resistors 16 while using a mask pattern or other method.

The circuit board 10 is manufactured by forming a circuit pattern 14 and the electrodes 14a, 14a in accordance with a predetermined pattern by a known method for forming any circuit board, such as a subtractive process.

Figure 2:
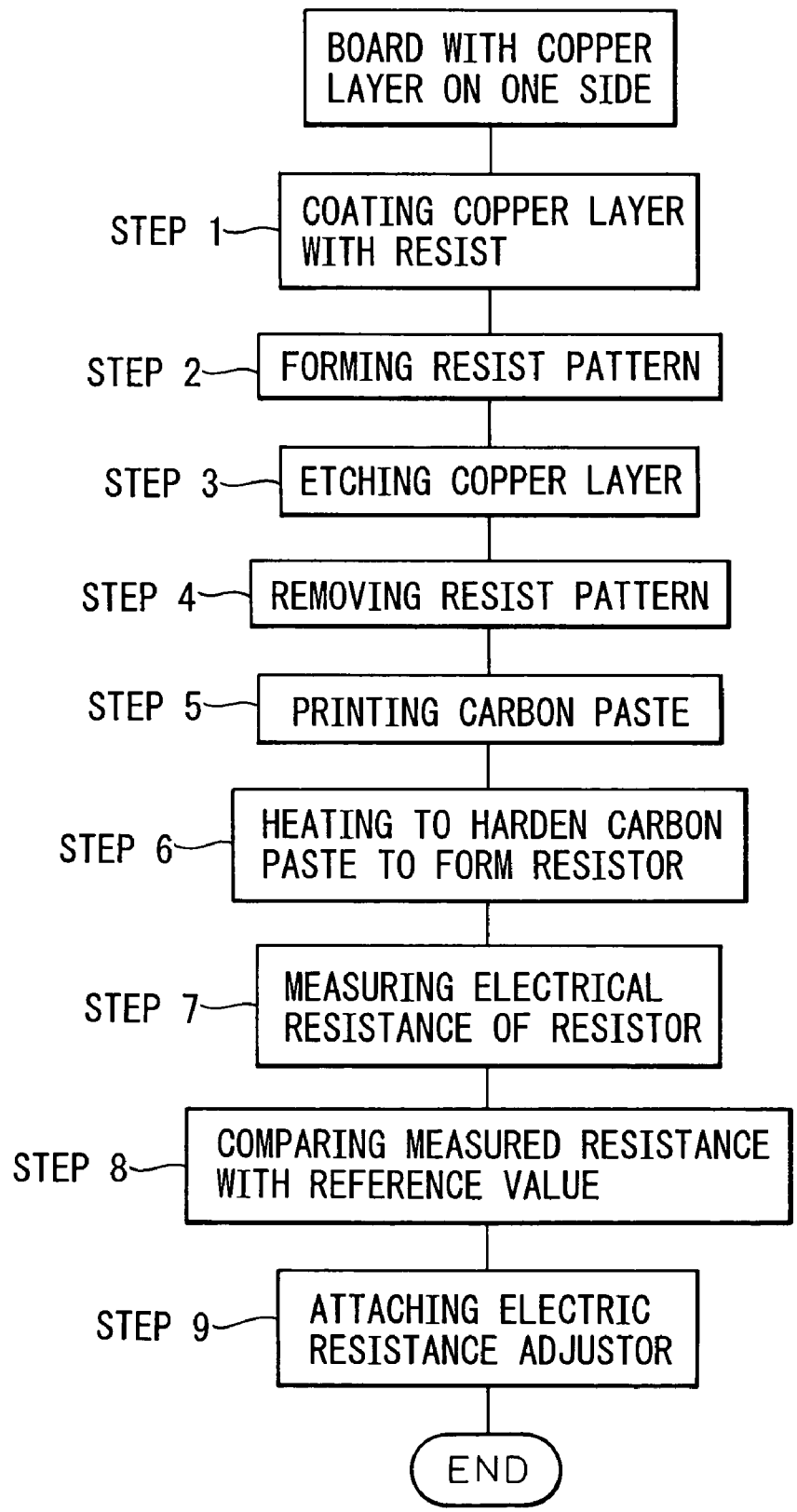
FIG. 2 is a flow chart schematically illustrating the production steps of the circuit board according to one embodiment of the present invention.

The method for manufacturing the circuit board by using the subtractive process will be described with reference to FIGS. 2 and 3. FIG. 2 is a flow chart schematically illustrating the production steps of the circuit board according to one embodiment of the present invention, and FIGS. 3(a) to 3(g) are illustrations of the circuit board in the respective steps in FIG. 2.

Figure 3A:
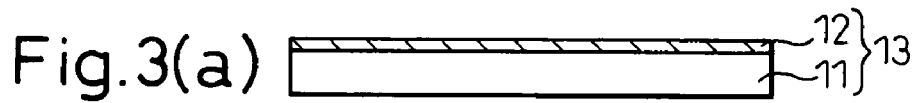
FIGS. 3(a) to 3(g) are illustrations of the circuit board in the respective steps in FIG. 2.
Figure 3B:
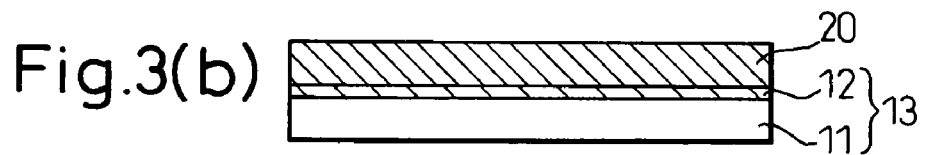
Figure 3C:
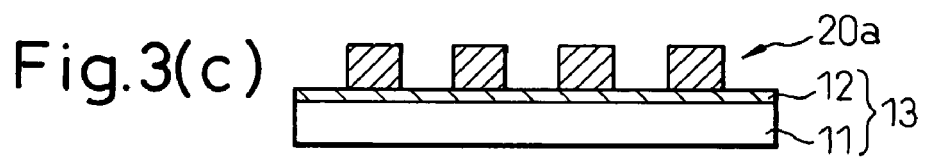

As shown in FIG. 3(a), first, a one-side copper-clad board 13 is prepared by adhering a copper foil 12 on one of the surfaces of a resinous board 11. As shown in FIG. 3(b), the one-side copper-clad board 13 is covered with a resist 20 (step 1). Then, the resist 20 is exposed to light in accordance with a circuit pattern and developed to form a resist pattern 20a in which portions to be a circuit pattern are concealed as shown in FIG. 3(c) (step 2).

Figure 3D:
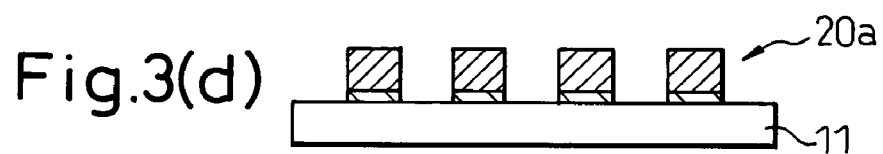

Next, part of the copper foil 12 exposed from the resist pattern 20a is removed by the etching as shown in FIG. 3(d) (step 3).

Figure 3E:
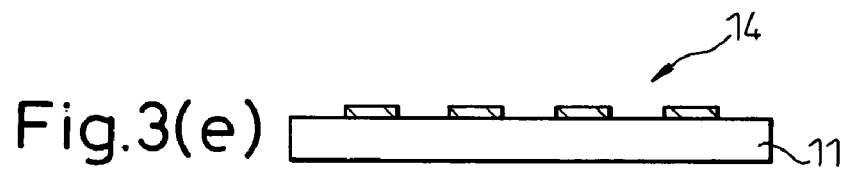

Subsequently, the resist pattern 20a is etched with a solvent for the resist and removed (step 4). FIG. 3(e) shows a state in which the resist pattern 20a has been removed. By the removal of the resist pattern 20a, the predetermined circuit pattern 14 is formed on the resinous board 11.

In this regard, according to this embodiment, while the resistor 16 is formed on the surface of the circuit board 10, it is also possible to obtain a multi-layered circuit board 10 by printing a plurality of resistors 16 in an intermediate layer or an uppermost layer in the same manner as in the above-mentioned method.

Figure 3F:
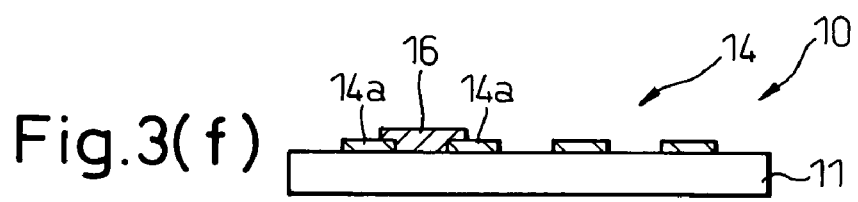

The resistor 16 is formed, as shown in FIG. 3(f), on the resinous board 11 on which the circuit pattern is formed. Reference numeral 14a denotes a pair of electrodes between which the resistor is formed. The resistor 16 is formed by printing carbon paste while using a mask having a slit of a predetermined width (step 5). The carbon paste is coated between the electrodes 14a and 14a so that opposite ends thereof are overlapped with the electrodes as shown in FIG. 1. After being coated, the carbon paste is heated and hardened to become the resistor 16 (step 6).

When the resistor paste such as carbon paste is printed or coated to form the resistor 16 as described above, a shape of the resistor 16 is not always exactly the same every time even if the same slit in the same mask is used for coating the carbon paste because the composition of carbon paste material may vary or the coating operation may fluctuate.

Figure 4A:
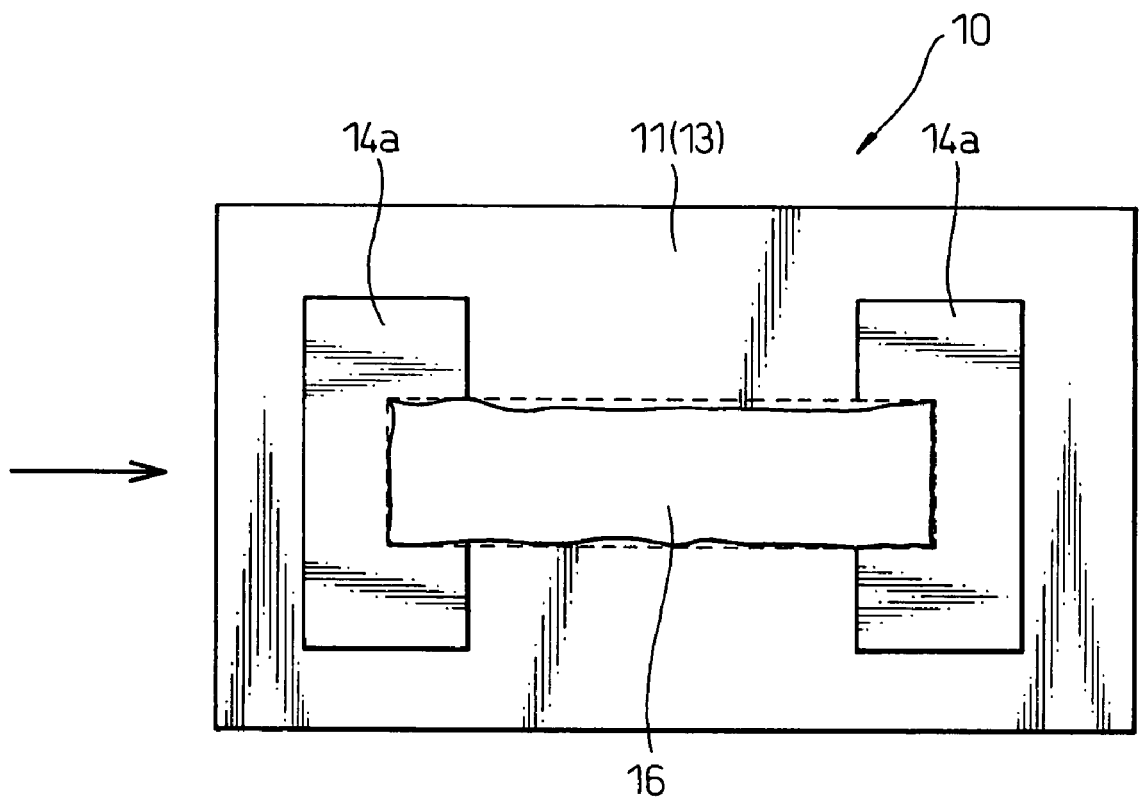
FIGS. 4(a) and 4(b) are illustrations of shapes of the resistor formed in the circuit board.
Figure 4B:
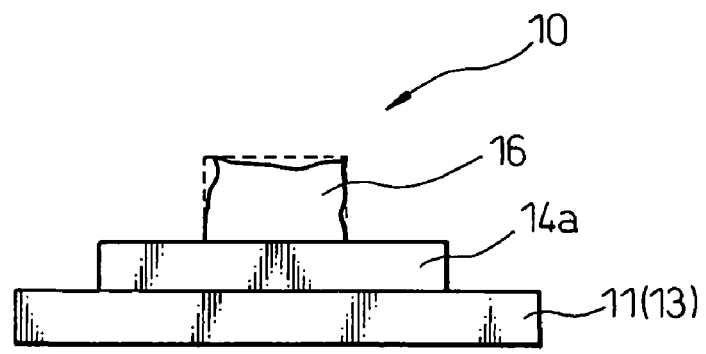

FIGS. 4(a) and 4(b) are illustrations of shapes of the resistor formed in the circuit board. FIG. 4(a) is a plan view and FIG. 4(b) a side view of FIG. 4(a) as seen in the direction shown by an arrow. In the drawings, a broken line indicates a designed shape of the resistor 16, and a solid line indicates an actually formed shape of the resistor 16. As indicated, the shape of the actually formed resistor 16 by printing the carbon paste is often different from the designed shape, whereby the electrical resistance value of the resistor 16 may be larger than the designed or reference electrical resistance value.

When the electrical resistance value of the resistor 16 is different from the designed or reference value as described above, the electrical resistance value of the resistor 16 is adjustable according to this embodiment to improve the yield of the circuit board 10.

Figure 3G:
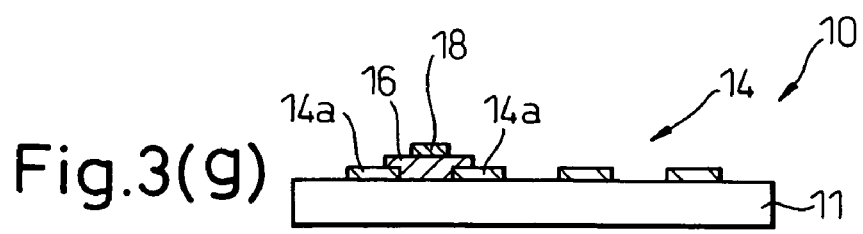

Concretely, the electrical resistances of the respective resistors are measured (step 7) to calculate the difference from the designed value (step 8). When the electrical resistance value of the actually formed resistor 16 is out of tolerance, conductor 18, such as gold, nickel or alloys thereof, having a conductivity higher than that of the resistor 16 is attached onto the surface of the resistor 16 as shown in FIG. 3(g) to adjust the electrical resistance value (step 9).

A method for attaching the conductor 18 to the surface of the resistor for the adjustment of the electrical resistance includes, for example, one in which the conductive paste is coated on the surface of the resistor 16 at a predetermined width by an ink jet, one in which the conductor 18 for the adjustment of the electrical resistance is plated on the surface of the resistor 16, and one in which a conductive piece having a predetermined width is adhered onto the surface of the resistor 16. Each of them may be suitably selected in accordance with the production process of the circuit board 10.

In this embodiment, as shown in FIG. 1, the conductor 18 for the adjustment of the electrical resistance is plated to cross the resistor 16 in the widthwise direction. By forming the conductor 18 on the surface of the resistor 16 to cross the latter, the electrical resistance value of a portion of the resistor 16 where the conductor 18 is formed becomes zero, which means that the length of the resistor 16 is substantially shortened and thus the electrical resistance value is reduced to an extent corresponding thereto.

Figure 5:
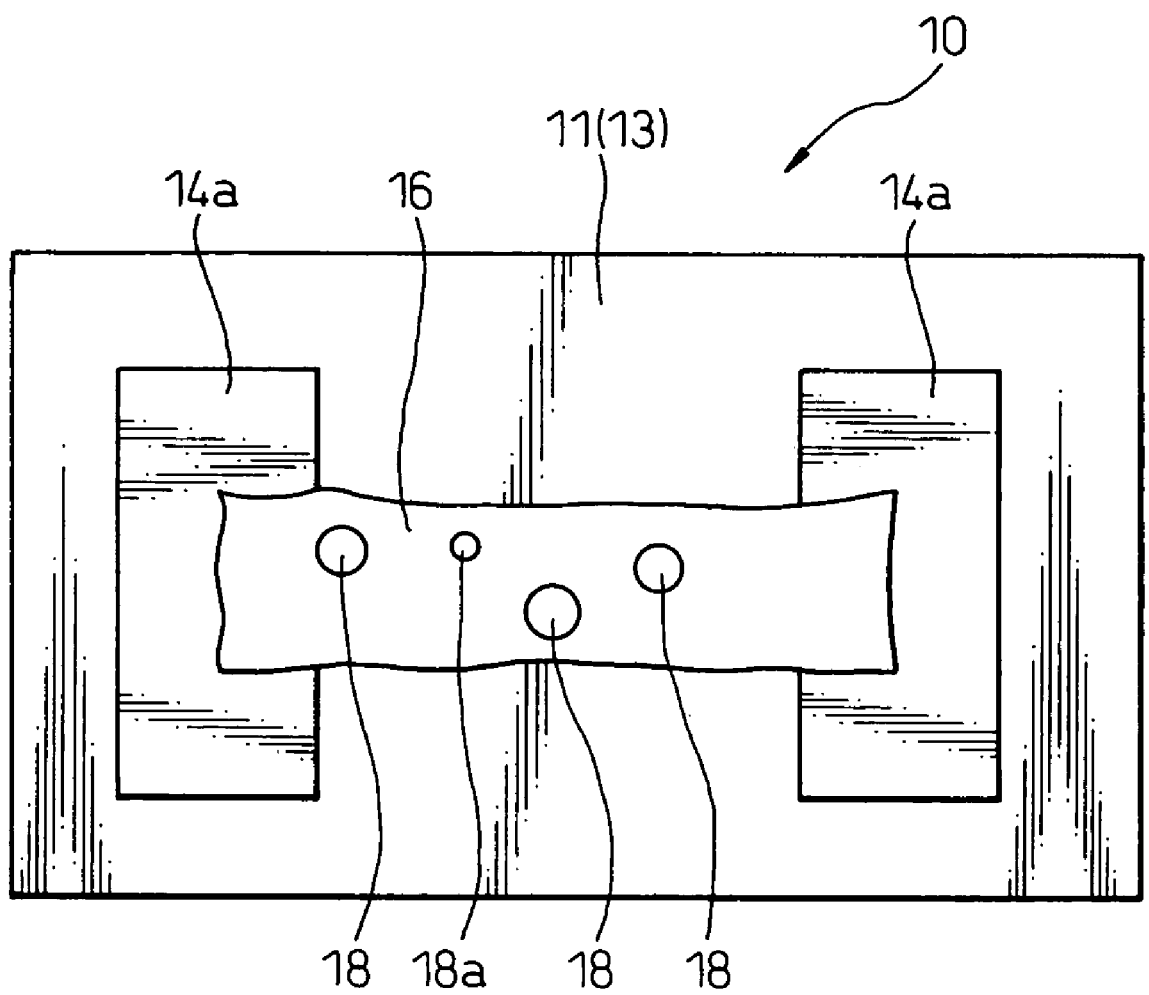
FIG. 5 is a plan view of a conductor for adjusting the electrical resistance formed in a spotted arrangement.

FIG. 5 illustrates another embodiment in which the conductors 18, 18a for the adjustment of the electrical resistance are formed in a spotted manner on the surface of the resistor 16. As illustrated, the conductor 18a may be provided not only to cross the resistor 16 in the widthwise direction but also to vary its area.

As described above, the conductors 18, 18a for the adjustment of the electrical resistance are provided while adjusting the area thereof on the surface of the resistor 16 based on the measured result of the electrical resistance value of the respective resistor 16. According to the method for coating the conductive paste by an ink jet process, efficient adjustment is possible because the conductive paste is suitably coated based on the measured electrical resistance value of the respective resistor 16. Of course, the size of the individual spotted conductors 18, 18a and the number of such conductors can be selected so as to obtain a suitable adjustment of the electrical resistance value.

As a method of this invention for adjusting the electrical resistance of the resistor 16 is effective when the electrical resistance value of the actually formed resistor 16 is higher than the designed electrical resistance value, it is also possible to intentionally design the electrical resistance value of the resistor 16 to be slightly higher than the aimed value when the resistor paste is printed, and after the resistor 16 has been formed, the conductor 18 for the adjustment of the electrical resistance is formed on the surface of the resistor 16 to adjust the resistor 16 to have the predetermined electrical resistance value. In this regard, when it is desirable to largely adjust the electrical resistance value of the resistor 16, the conductor 18 for the adjustment of the electrical resistance is preferably formed in the widthwise direction. On the contrary, when it is desirable to slightly adjust the electrical resistance value of the resistor 16, the conductor 18 for the adjustment of the electrical resistance is preferably formed in the lengthwise direction.

According to the above-mentioned method, it is possible to manufacture the circuit board 10 having the designed electric characteristics by the adjustment of the resistor 16 formed on the surface of the circuit board 10.

Also, according to the present invention, it is possible to avoid a failure in the adjustment of the electrical resistance value of the resistor 16 and improve the production yield of the circuit board 10 to a great extent without damaging the resistor 16 or the resinous board, unlike the conventional trimming of the resistor 16 by a laser beam.

Further, as a laser beam is not used for adjusting the electrical resistance value of the resistor 16, no micro-cracks are generated on the surface of the resistor 16 and no change occurs, over time, in the electric characteristics of the resistor 16, whereby the reliability in the electric characteristics of the circuit board 10 is maintained for a long period.

By using the inventive method for manufacturing a circuit board, the following operation and effect are obtainable.

As the electrical resistance of the resistor in the circuit board is measured and adjusted, the circuit board having the designed electric characteristics is provided.

As the resistor or the circuit board is not damaged and the adjustment of the electrical resistance value of the resistor does not fail, it is possible to improve the yield of the circuit board to a great extent, whereby the reliability of the electric characteristics of the circuit board is enhanced.

Further, if the adjustment of the resistor is carried out by the plating, it is possible to use a process for manufacturing a multi-layered circuit board, provided an other proper process is combined therewith, whereby the adjustment may be effectively carried out.

The invention claimed is:

1. A circuit board in which a resistor consisting of a resistor paste is printed between electrodes formed on a circuit pattern printed on said circuit board, comprising:
   a conductor adjusting an electrical resistance value of the resistor, having a conductivity higher than that of the resistor, coated on the surface of the resistor and partially formed on a surface of said resistor, wherein a location on the surface of the resistor in which the conductor is formed and an area of the conductor are varied based on a measured electrical resistance value of the resistor.

2. A method for producing a circuit board, comprising:
   forming a circuit pattern on the surface of a circuit board;
   printing a resistor between electrodes in the circuit pattern with resistor paste;
   measuring an electrical resistance value of the resistor; and
   forming a conductor of a predetermined area, for adjusting the electrical resistance value, having a conductivity higher than that of the resistor when the measured electrical resistance value is outside a designed tolerance thereof, said conductor being partially formed on a surface of said resistor, location on the surface of the resistor in which the conductor is formed and an area of the conductor being varied based on a measured electrical resistance value of the resistor.

3. A method for producing a circuit board as defined by claim 2 wherein, in the forming the conductor of the predetermined area for adjusting the electrical resistance, conductive paste is coated in a predetermined area on the surface of the resistor.

4. A circuit board in which a resistor consisting of a resistor paste is printed between electrodes formed on a circuit pattern printed on said circuit board, comprising:
   a conductor coated on the surface of the resistor and partially formed on a surface of said resistor, wherein a location on the surface of the resistor in which the conductor is formed and an area of the conductor are varied based on a measured electrical resistance value of the resistor.

* * * * *

UNITED STATES PATENT AND TRADEMARK OFFICE
CERTIFICATE OF CORRECTION

PATENT NO.       : 7,423,513 B2                               Page 1 of 1
APPLICATION NO.  : 10/855342
DATED            : September 9, 2008
INVENTOR(S)      : Koichi Tanaka It is certified that error appears in the above-identified patent and that said Letters Patent is hereby corrected as shown below:

Column 6, Line 15, before "location" insert --a--.

Signed and Sealed this

Twenty-third Day of December, 2008

JON W. DUDAS
*Director of the United States Patent and Trademark Office*